US006937582B1

(12) United States Patent
Kronestedt

(10) Patent No.: US 6,937,582 B1
(45) Date of Patent: Aug. 30, 2005

(54) METHOD AND AN ARRANGEMENT RELATING TO MOBILE RADIO SYSTEMS WITH THE POSSIBILITY OF SWITCHING CHANNEL CODING SCHEMES

(75) Inventor: Carl Fredric Ulf Kronestedt, Stockholm (SE)

(73) Assignee: Telefonaktiebolaget LM Ericsson (publ), Stockholm (SE)

(*) Notice: Subject to any disclaimer, the term of this patent is extended or adjusted under 35 U.S.C. 154(b) by 868 days.

(21) Appl. No.: 09/672,007

(22) Filed: Sep. 29, 2000

(30) Foreign Application Priority Data

Oct. 1, 1999  (SE) .................................. 9903551

(51) Int. Cl.$^7$ ............................................ H04Q 7/00
(52) U.S. Cl. .................... 370/329; 370/343; 370/465; 370/480; 375/132; 375/299; 455/450
(58) Field of Search ................. 370/330, 343, 370/344, 465, 329, 337, 345, 478, 480; 375/132, 375/267, 295, 299, 133–137; 455/117, 428, 455/447, 450

(56) References Cited

U.S. PATENT DOCUMENTS

| | | | | |
|---|---|---|---|---|
| 4,914,649 A | * | 4/1990 | Schwendeman et al. .... | 370/311 |
| 5,095,500 A | | 3/1992 | Tayloe et al. | |
| 5,428,602 A | * | 6/1995 | Kemppainen ............... | 370/330 |
| 5,903,834 A | * | 5/1999 | Wallstedt et al. ......... | 455/422.1 |
| 5,937,002 A | * | 8/1999 | Andersson et al. .......... | 375/131 |
| 6,151,310 A | * | 11/2000 | Dent ........................... | 370/330 |
| 6,466,794 B1 | * | 10/2002 | Posti et al. .................. | 455/450 |
| 6,778,831 B1 | * | 8/2004 | Sancho et al. .............. | 455/436 |
| 2003/0133516 A1 | * | 7/2003 | Alamouti et al. ........... | 375/295 |

FOREIGN PATENT DOCUMENTS

| | | |
|---|---|---|
| GB | 2318252 | 4/1998 |
| WO | 96/19880 | 6/1996 |
| WO | 97/15131 | 4/1997 |

OTHER PUBLICATIONS

Gregory J. Pttie and Robert Calderbank, ☐☐Channel Coding Strategies for Cellular Radio, ☐☐Nov. 1995☐☐IEEE Transactions on Vehicular Technology, vol. 44 No. 4.*
Anders Furuskär et al. "Capacity Evaluation of the EDGE Concept for Enhanced Data Rates in GSM and TDMA/136", IEEE Vehicular Technology Conference 99.
Stefan Eriksson et al. "Comparison of Link Quality Control Strategies for Packet Data Services in EDGE", IEEE Vehicular Technology Conference 99, 0-7803-5565-2/99.

* cited by examiner

*Primary Examiner*—Dang Ton
*Assistant Examiner*—Inder Pal Mehra

(57) ABSTRACT

The present invention relates to a mobile radio system in which channel coding on the radio link is changed during an ongoing connection. The invention can be related in particular to the packet data services GPRS and EDGE. According to the invention, a change of radio channel is made from a frequency hopping channel to a non frequency hopping radio channel in connection with changing the channel coding during an ongoing radio connection, wherein channel coding of user data that has earlier been channel coded is terminated when transmitted by radio. Channel changes are effected within a cell.

17 Claims, 3 Drawing Sheets

METHOD AND AN ARRANGEMENT RELATING TO MOBILE RADIO SYSTEMS WITH THE POSSIBILITY OF SWITCHING CHANNEL CODING SCHEMES

This application claims priority under 35 U.S.C. §§119 and/or 365 to 9903551-1 filed in Sweden on Oct. 1, 1999; the entire content of which is hereby incorporated by reference.

TECHNICAL FIELD

The present invention relates to an arrangement and a method pertaining to a mobile radio system that provides a packet data service and which includes means for adapting coding on a radio connection in accordance with prevailing radio conditions.

BACKGROUND OF THE INVENTION

The well known mobile radio system GSM is a TDMA-system (Time Division Multiple Access) designed for frequency hopping.

TDMA involves the time-wise division of a carrier wave frequency into a number of time slots, eight time slots/carrier wave in respect of the GSM-system. The eight time slots recur at given intervals and each recurring time slot is corresponded by a radio channel.

By a frequency hopping system is meant a system in which a radio channel changes its carrier wave frequency during an ongoing connection. In the case of the GSM-system, the carrier wave frequency is switched between each channel time slot. Normally, switching of a carrier wave frequency normally takes place in accordance with a predetermined scheme, a so-called hop sequence. In the case of a frequency hopping system, a channel is defined by its allocated hop sequence and time slot, whereas a channel is defined by its carrier wave frequency and time slot in the case of a non frequency-hopping system.

Fading is a problem with respect to radio communication and occurs as a result of multipath propagation of the radio wave between a transmitter and a receiver. This means that in certain positions in space, the various wave propagation paths co-act to obtain a high signal strength, whereas immediately adjacent signals having different wave propagation attenuate each other so as to result in a low signal strength. Positions with low signal strengths are called fading dips. Data that is sent to a mobile station, which is located in a fading dip, will often be lost. In the case of a mobile radio system that has a relatively narrow bandwidth, such as the GSM-system, fading dips will occur at different positions for different carrier wave frequencies.

The problem associated with fading dips is reduced by frequency hopping a channel. The risk of the mobile station being located within a fading dip during the course of several time slots then no longer exists, whilst the likelihood of individual time slots being knocked out by a fading dip increases at the same time. By coding user data and interleaving the coded data, i.e. cut up sequences of the data and mixing the same with other sequences over a longer period, the user data can be recovered in a receiver even though individual time slots have been lost.

Frequency hopping, however, requires the use of advanced equipment. Those mobile stations that were produced when the GSM-system was new were unable to make frequency hops. Consequently, several years passed before operators introduced frequency hopping in their respective networks.

Fixed frequency planning is applied in existing GSM-systems, i.e. each cell included is allocated a number of carrier wave frequencies with corresponding radio channels in order to be able to serve mobile stations within the cell with communication. The GSM-system was originally adapted to be a telephony system that transmitted speech between users. In the case of speech connections, it is important that the information between the terminal users is not delayed, since it would then not matter so much if the information is somewhat distorted. User data, i.e. speech that is transmitted over the radio connection, is always sent channel coded in accordance with a predetermined coding scheme. Quality is measured in order to maintain satisfactory quality on the radio connection. On downlink, i.e. on the link from a base transceiver station BTS to a mobile station MS, quality is measured in the mobile station. The results of the measurements are then sent in reports to the base transceiver station BTS. On the uplink, i.e. the link from the mobile station to the base station, quality measurements are made in the base station. The base station is connected to a base station controller. The results of the measurements are evaluated in the base station controller and controlled so as to maintain correct quality on the radio connection. The base station controller includes two devices for effecting this control, these devices being one for varying the transmitted radio power and another for switching radio channels. Radio channel switching can be effected within the own cell and is designated intracell handover. Intracell handover is normally implemented when the received signal strength is high but the channel is disturbed by another transmitter, so-called interference. Radio channels can also be switched between cells, designated intercell handover. This procedure is used when the mobile station is mobile and enters a new cell. The signal strength on the old channel/cell is thus impaired, and, at the same time, improves on a channel in the new cell.

In addition to the aforesaid telephony service, a packet data service designated GPRS (General Packet Radio Service) is now being standardised for the GSM-system and TDMA/136. As the name implies, GPRS is designed to send packet data between two users. As distinct from speech in respect of telephony, user data in respect of packet data transmission is not particularly sensitive to delays, but, on the other hand, is highly prone to lose information. Data sent from a transmitter to a receiver is divided into blocks. Each block is provided with check bits, which enable it to be ascertained whether the block detected is correct, or not. When the block detected is found to be erroneous, the receiving equipment requests the transmitting equipment to re-transmit the block. A mobile station may be a transmitter, a receiver or both and at the same time, i.e. a transceiver.

A logic function designated Link Adaptation checks and controls the transmission over the radio connection; i.e. adapts the radio link in accordance with the prevailing radio environment. There is a significant difference between link adaptation for GPRS and the control of a radio connection in telephony. In the case of telephony, it is necessary for transmission quality to exceed a lowest threshold in order to be acceptable. If this cannot be achieved on the channel used at that time, the channel is changed. The purpose of GPRS Link Adaptation is to maintain the highest possible data rate for user data on an allocated radio channel. Data rate is influenced by the extent to which the ambient radio environment interferes with the radio channel in question. The data rate is decreased when it is necessary to send data blocks as a result of the blocks not being received correctly. The number of symbols that are changed on a radio channel that is subjected to a difficult radio environment will be more than the number of symbols changed on a channel that is subjected to a simpler radio environment.

There are four alternative channel coding schemes for coding user data that is transmitted over the radio link. The first coding scheme CS1 applies to each bit of user data a single bit coding, i.e. the user data in the transmitted coded data has a proportionality of 1:2. CS1 is intended for the most difficult radio environment. The second and third coding schemes CS2 and CS3 have a respective proportionality of ⅔ and about ¾ on the user data in the coded data, and are adapted for correspondingly less harsh interference on the radio channel. According to the fourth coding scheme CS4, the user data is not coded at all, i.e. the user data proportionality is ¹⁄₁. CS4 is preferably only used when the radio environment is very good.

The purpose of link adaptation is to evaluate the quality of a radio connection to which a given radio channel has been allocated and to select a coding scheme with which the highest possible data rate is obtained. If data is transmitted with insufficient coding, the proportion of wrongly detected frames will increase, meaning that these frames must be re-transmitted and therewith result in a lower data rate. If an excessively strong coding is used, the data rate will be reduced by virtue of the fact that the capacity available is not used for user data. Switching between coding schemes takes place dynamically during an ongoing connection, in response to changes in the radio environment. The criteria which determine when a coding scheme change shall take place have been pre-selected.

When a new connection is established, transmission is effected initially with either CS1 or CS2. Estimation of the radio quality is then also commenced and a switch to a coding scheme, which involves a lower coding proportionality, i.e. to CS3 or CS4, is made when the result of the measurements indicates that this is necessary.

When the radio environment worsens, a coding scheme change is effected according to GPRS, such as to increase coding of the user data. The telephony service of the GSM-system on the other hand would have carried out an intracell handover if the quality of the radio connection were to fall beneath a given value. Consequently, intracell handover is not a term in GPRS. It is, however, technically possible to effect a change of radio channel within the cell. A channel change is called a Packet Timeslot Reconfiguration TS GSM 04.60.

EDGE is another new standard within the GSM-system and TDMA/136, which was still not fully specified at the time of filing of the instant patent application. EDGE is based on GPRS but makes a still higher data rate possible through the medium of a further modulation method. The introduction of EDGE provides eight different alternative radio channel modes, designated MCS1–MCS8. The first four modes MCS1–MCS4 of these eight modes conforms with the GPRS modulation method and, in principle, also to the coding schemes CS1–CS4. The four new modes MCS5–MCS8 have, in principle, the same type of coding as CS1–CS4, but use 8PSK instead of GSMK as a modulation method and therefore give twice the data rate.

In a scientific document entitled "Capacity Evaluation of the EDGE Concept for Enhanced Data Rates in GSM and TDMA/136, A. Furuskär, M. Höök, S. Jäverbring, H. Olofsson, J. Sköld, published at the conference "IEEE Vehicular Technology Conference 99", a comparison is made of data rates on block levels for the different modes of EGPRS/?/ with and without frequency hops. EGPRS is not defined, but is thought to correspond to EDGE. It is said that the link quality control scheme used lowers the performance of the higher rates with frequency hops. According to the document, however, this difference is expected to decrease with current link quality control schemes that reduce the depth of interleaving.

In another document "Comparison of Link Quality Control Strategies for Packet Data Services in EDGE" 0-7803-5565-2/99, published at the same time as and by the same authors as the above-mentioned document, (radio) link quality control is considered and suitable block lengths for achieving high data rates are discussed. It is proposed that the blocks are divided into sub-blocks in respect of the modes MCS-8 that enable the highest possible data rates to be achieved. One of several reasons for dividing a block into sub-blocks is that a fading dip in a frequency hop need only knock out a sub-block instead of an entire block.

U.S. Pat. No. 5,095,500 describes how the geographical position of a mobile station can be determined with the aid of signals transmitted over a radio channel. This technique, however, has hardly any relevance to the present invention.

SUMMARY OF THE INVENTION

The present invention is based on the problem of maintaining the highest possible data transmission rate over a radio connection when changing the coding scheme whilst the connection is ongoing.

Accordingly, the object of the present invention is to enable the highest possible data transmission rate to be maintained over a radio connection in respect of different types of coding schemes.

The present invention is based on the observation that a radio channel should frequency hop when data sent over the channel is channel coded, while when channel coding of the data ceases, the radio channel should also cease to frequency hop in order to retain good transmission quality. The invention is also based on the observation that a change from a frequency hop to the absence of a frequency hop is facilitated when the radio channel for the radio link is also changed.

The present invention solves the aforesaid problem by means of a method in which a radio channel change is made in conjunction with changing channel coding. When channel coding is changed so that data is sent non-channel coded from having been sent channel coded over a frequency hopping radio channel, the radio channel is also changed to a non frequency hopping radio channel.

The present invention also solves the aforesaid problem with the aid of a base station system and a base station controller that include means for switching or changing between channel coding schemes when the results of measuring transmission quality fulfil certain criteria, and also means for switching a radio channel from a frequency hopping channel to a non frequency hopping channel in conjunction with the change of channel coding.

The present invention has the advantage of enabling the radio spectrum to be utilised effectively. The radio spectrum is a scanty resource that must be utilised extremely effectively. The present invention enables performance to be improved when data is sent over a radio channel without being channel coded. This improvement in performance means less risk of data being wrongly interpreted, that less data needs to be re-transmitted, and that the transmission rate on a connection is therewith improved.

Another advantage afforded by the invention is that carrier wave frequencies that have been allocated to a base transceiver station are divided into at least one carrier wave frequency that only has non frequency hopping channels and carrier wave frequencies that have only frequency hopping channels. This facilitates distribution of channels to different users. In this way, a carrier wave used for broadcasting in the cell carries only non frequency hopping channels, therewith enabling simpler channel transmission equipment to be used.

The invention also has the advantage of utilising existing functions in a mobile radio network, therewith enabling the invention to be applied more readily.

The invention will now be described in more detail with reference to preferred embodiments thereof and also with reference to the accompanying drawings.

DESCRIPTION OF PREFERRED EMBODIMENTS

Figure 1:
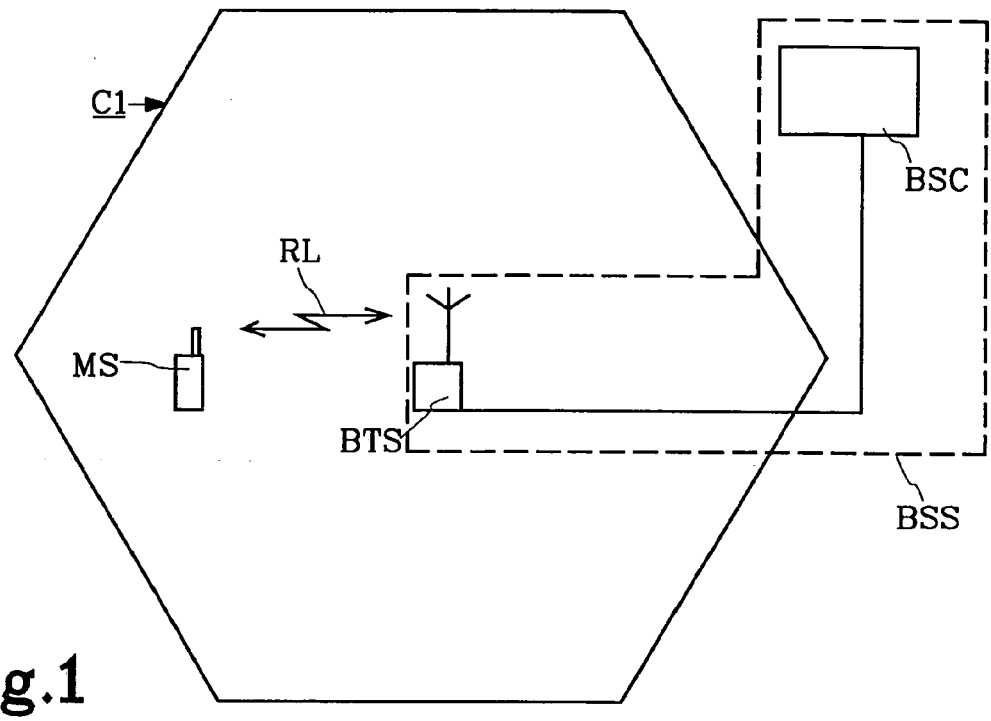
FIG. 1 is a view illustrating parts of the known mobile radio system GSM.

FIG. 1 illustrates a limited part of a GSM-system PLMN relevant to the present invention. The illustrated network includes a base station controller BSC that is connected to the remainder of the mobile radio system via a mobile services switching centre MSC (not shown). The base station controller is connected to a base transceiver station BTS, which together form a base station system BSS. The base transceiver station serves mobile stations within a neighbouring geographical area, called cell C1, with radio communication. For the sake of simplicity, only one mobile station MS is shown in the cell C1 in FIG. 1.

Also indicated in FIG. 1 is a radio link RL on a radio channel between the mobile station MS and the base transceiver station BTS. Radio links RL are in duplex in the GSM-system. This means that a link has a pair of radio channel available, i.e. one radio channel for downlink, i.e. in a direction from the base transceiver station to the mobile station MS, and an oppositely directed radio channel, called the uplink. Unless otherwise stated, the pair of radio channels is referred to hereinafter as the radio channel.

Figure 2:
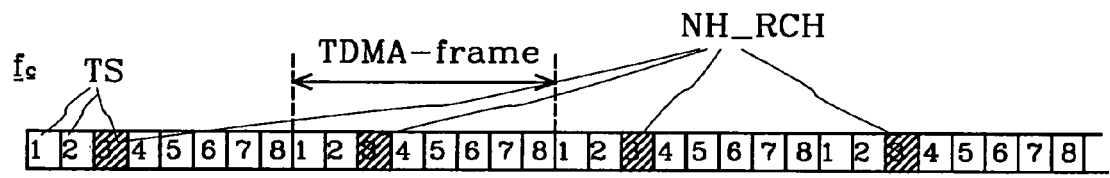
FIG. 2 a graphic illustration of a channel definition according to the TDMA principle.
Figure 3:
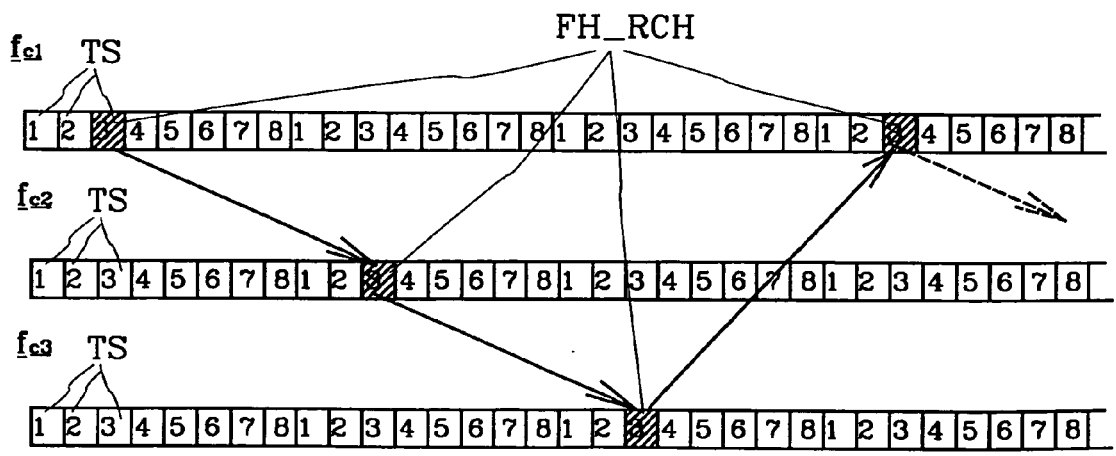
FIG. 3 is a graphic illustration corresponding to that of FIG. 2 showing a frequency hopping radio channel.

In the GSM-system PLMN, the radio spectrum is divided into radio channels in accordance with the TDMA principle, meaning that the spectrum is divided into a number of carrier wave frequencies that have a given frequency bandwidth. FIG. 2 illustrates a carrier wave frequency $f_c$. The carrier wave frequency $f_c$ is divided into time slots TS of a given time length, with the time slots TS being consecutive. Eight consecutive time slots TS are divided into a TDMA-frame. Each time slot in a TDMA-frame corresponds to a radio channel. The radio channel has access to a given numbered time slot TS in each of the mutually sequential TDMA-frames. Respective uplink and downlink channels have different carrier wave frequencies $f_c$ spaced with a given frequency separation. A radio link RL has access to a channel pair that includes an uplink and a downlink channel. There are two types of radio channels, to-wit frequency hopping radio channels and non frequency hopping radio channels. A non frequency hopping radio channel uses a given time slot on a given carrier wave frequency. For example, time slot 3 in each recurrent TDMA-frame on the carrier frequency $f_c$ in FIG. 2 constitutes a non frequency hopping radio channel NH_RCH. A frequency hopping radio channel uses a given time slot in a recurrent TDMA-frame that switches carrier wave frequency in accordance with a given pattern, a so-called hop sequence. FIG. 3 illustrates a frequency hopping radio channel FH_RCH that uses time slot TS 3 in each TDMA-frame with a switch between three different carrier wave frequencies $f_{c1}$–$f_{c3}$ in accordance with a given hop sequence. FIGS. 2 and 3 show only one direction of the radio channel, i.e. solely the uplink or the downlink on the frequency hopping channel FH_RCH and the non frequency hopping radio channel NH_RCH. The principle for changing the direction in the channel pair is the same as that illustrated. This means that both links in a channel pair either frequency hop or do not.

Frequency hopping channels have a random hopping sequence, although only the more usual variant with a predetermined hopping sequence is described here.

It is assumed in the following that the cell C1 has been allocated a set of carrier wave frequencies $f_c$, $f_{c1}$–$f_{c3}$ and that the carrier waves are divided into carrier waves $f_{c1}$–$f_{c3}$ that have solely frequency hopping radio channels FH_RCH, and at least one carrier wave $f_c$ that has only non frequency hopping radio channels NH_RCH. The radio link RCH between the mobile station MS and the base transceiver station BTS is a link in a full chain for sending user data between a user of the mobile station MS and another terminal in, for instance, a fixed telephone network or data network connected to the GSM-system PLMN. The information to be transmitted by the chain is designated user data. Control data must be added to the user data for transmission along the chain, this control data normally being included in a control header that is transmitted with a user data subset. The radio link RCH differs from other links in the transmission chain, by being subjected to external interferences that distort the transmitted information. User data is channel coded prior to being sent over the radio link RL, so as to enable the original information to be recovered in the receiving mobile station MS or in the receiving base transceiver station BTS, even if certain bits are distorted when received.

The present invention is related, among other things, to the packet data service GPRS. According to GPRS, there are four alternative channel coding schemes CS1–CS4 for channel coding on the radio link RL. Switching of a channel coding scheme is effected during an ongoing connection in response to variations in the interference on the radio channel. This interference is evaluated with the aid of several measured parameters, of which the signal/interference ratio C/I is one of the more important parameters. The first coding scheme CS1 appends to the user data the same proportion of bits of redundant information as the proportion of original bits in the user data; coding proportionality is thus ½. CS1 is intended for the most troublesome radio interference, with C/I about 7 dB or higher. CS2 and CS3 append a lower proportion of redundant information to user data and are intended for lower radio channel interference; see the table below. CS4 appends no redundancy to the user data at all, i.e. no channel coding, and is intended for a very good radio environment, meaning that C/I is about 18 dB or higher. The following table also shows the data rate for user data obtained with the different channel coding schemes. Channel coding is described more exhaustively in TS GSM 05.03.

| Channel Coding Scheme | Code Rate | Data Rate User Data | C/I< |
|---|---|---|---|
| CS1 | 1/2 | 8 kbit/s | ~7 dB |
| CS2 | ~2/3 | 12 kbit/s | ~10 dB |
| CS3 | ~3/4 | 14.4 kbit/s | ~13 dB |
| CS4 | 1 | 20 kbit/s | ~18 dB |

Figure 4:
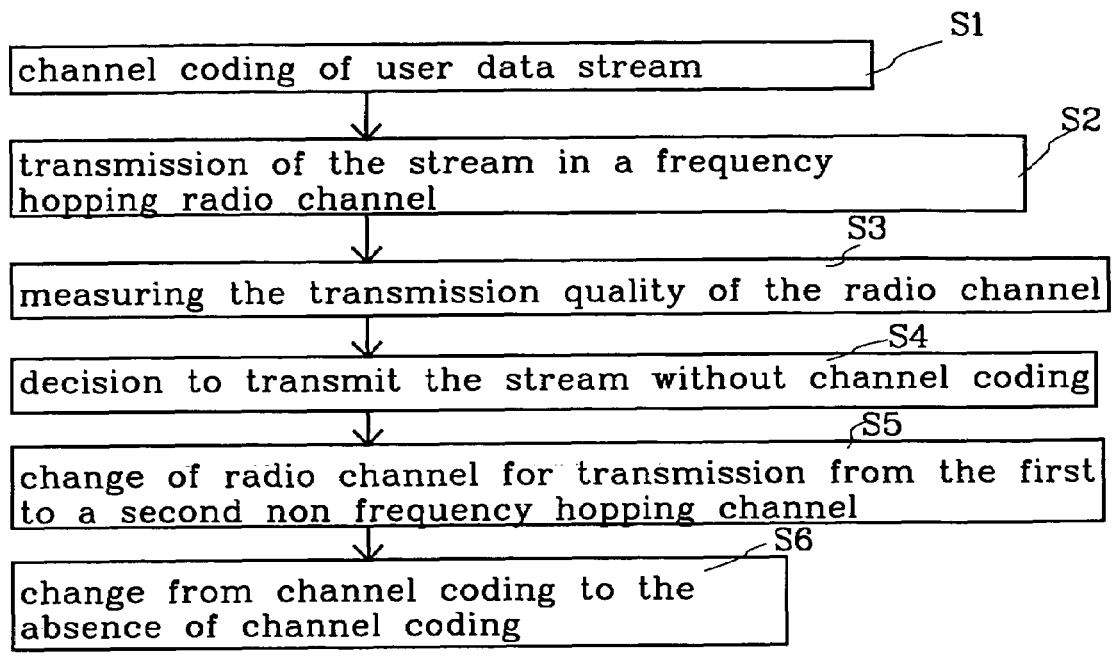
FIG. 4 is a flowchart illustrating the inventive method steps.

FIG. 4 illustrates the inventive method steps taken in controlling the radio link RL during an ongoing connection. A stream of user data is channel coded in a first step S1. This is effected by appending redundant information to the stream of user data in accordance with one of the coding schemes CS1, CS2 or CS3.

In a following step S2, the channel coded stream of user data is sent over a frequency hopping radio channel FH_RCH.

In a following step S4, it is decided that the channel coding scheme shall be switched to CS4, wherein the user data will be transmitted over the radio link RL without being channel coded. The decision is reached by comparing the measured transmission quality with pre-set criteria for the switch to CS4.

In a step S5, the radio channel for the radio link RL is switched from the frequency hopping channel FH_RCH to a non frequency hopping radio channel NH_RCH. Transmission of user data is continued on the non frequency hopping radio channel NH_RCH.

In a following step S6, the coding scheme is switched to CS4 and channel coding of the user data is terminated.

Briefly, in conjunction with termination of the channel coding of user data, i.e. a switch to CS4, the invention involves switching of the radio channel from a frequency hopping radio channel to a non frequency hopping radio channel. The order in which the radio channel change or the coding scheme change is first effected is of less importance.

The channel change is preferably carried out in the cell C1. According to GPRS, a channel change within the cell is designated "Packet Timeslot Reconfiguration".

Figure 5:
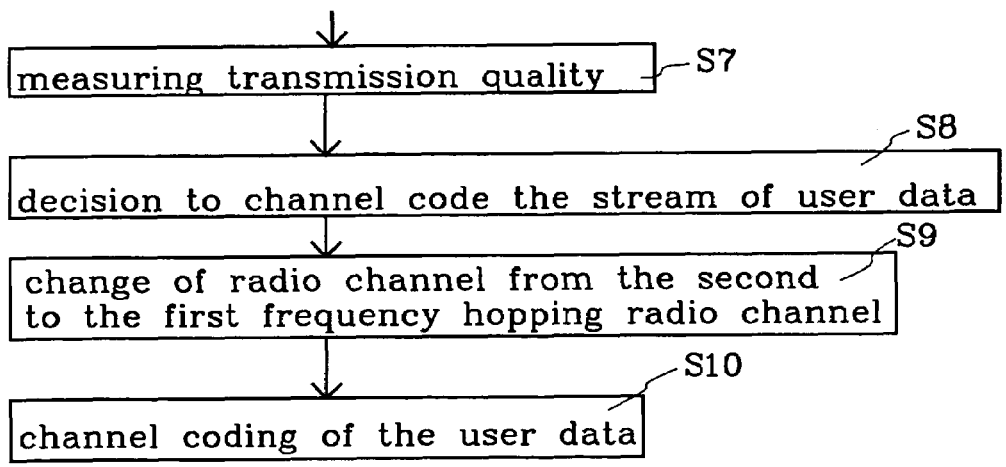
FIG. 5 is a flowchart illustrating the steps in an optional continuation of the steps shown in FIG. 4.

FIG. 5 illustrates further method steps that suitably follow step S6. In a step S7, the transmission quality on the radio link RL is measured, where user data is sent non-channel coded over the non frequency hopping radio channel NH_RCH in accordance with CS4.

It is decided in a following step S8 that channel coding of the user data shall commence in accordance with one of the coding schemes CS1, CS2 or CS3. The decision is made in accordance with the same principle as that described with reference to step S4.

The change from the non frequency hopping radio channel NH_RCH to a frequency hopping channel FH_RCH takes place thereafter in accordance with a following step S9. Transmission of the user data then continues on the frequency hopping channel FH_RCH. The method according to step S1 is then commenced.

Figure 6:
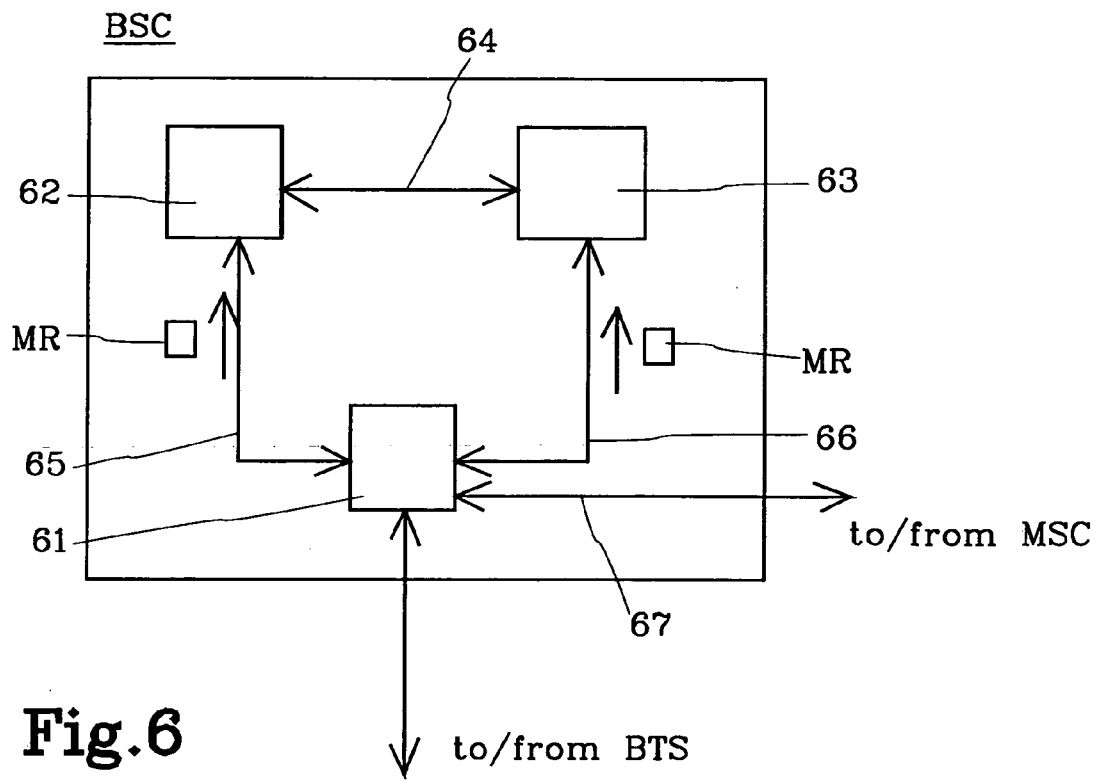
FIG. 6 is a block diagram of a base station controller according to the invention.

The logic function for link adaptation is handled in the GSM-system by the base station controller BSC. The base station controller BSC receives reports concerning the measured transmission quality. The base station controller determines which coding scheme shall be used for the radio link RL, by comparing the transmission quality with pre-set criteria. The base station controller BSC controls the base transceiver station BTS and the mobile station MS to use a chosen coding scheme, by sending a command to said stations. Link adaptation also controls a radio channel change in conjunction with changing a channel coding scheme that causes channel coding to terminate or to commence. FIG. 6 is a block diagram that illustrates a base station controller. Only those blocks in the base station controller that are relevant to the present invention are shown in FIG. 6. The base station controller is connected with the base transceiver station BTS via an I/O unit 61 (Input/Output). The base station controller also includes a link adaptation unit 62 and a radio channel division unit 63. Both have a duplex connection 65, 66 to the I/O unit 61, for receiving measurement reports MR from and sending commands to the base transceiver station BTS. The base station controller also has a connection 67 that connects it to a mobile switching centre MSC (not shown). The link adaptation unit and the channel allocation unit are known to the art. The channel allocation unit 63 includes means which order the base transceiver station and the mobile station MS to switch to a new channel. The novelty lies in the link adaptation unit 62 being equipped to send a control command CMD demanding a change of radio channel to or from a frequency hopping channel FH_RCH, via a connection 64 to the channel allocation unit 63.

The link adaptation and channel allocation units 62, 63 are preferably constructed as a logic block in a central processor, although they may alternatively have the form of separate physical units in the base station controller.

The radio link RL comprises an uplink and a downlink that use separate radio channels. The transmission quality can differ between the uplink and downlink and consequently link adaptation is effected separately for the uplink and downlink respectively. The transmission quality in uplink is measured in the base transceiver station in accordance with steps S3 and S7. The results of these measurements are sent in measurement reports MR to the base station controller BSC.

Transmission quality in downlink is measured in the mobile station MS in accordance with steps S3 and S7 and creates measurement reports MR that are sent on uplink to the base station controller via the base transceiver station BTS. The measurement reports MR are sent between the mobile station MS and the base transceiver station BTS on a packet associated control channel PACCH. Thus, link adaptation in accordance with method steps S1–S10 is effective separately for uplink and downlink respectively. The link adaptation that manages the downlink receives measurement reports MR from the mobile station and controls the base transceiver station to channel code user data in accordance with the given channel coding scheme. The link adaptation that manages the uplink receives measurement reports MR from the base transceiver station BTS and sends commands to the mobile station MS ordering said station to channel code user data in accordance with the given channel coding scheme. The channel coding scheme is sent to the mobile station MS on the PACCH channel with the message packet uplink acknowledgement. In which capacity/?/and how often and how the mobile station measures the transmission quality is described in detail in TS GSM 05.08. The manner in which the base station system BSS controls the mobile station to measure and send measurement reports MR is described in TS GSM 04.60, version 6.0.0 or a later version. Measurement of the transmission quality in uplink, i.e. in the base transceiver station BTS, is described in TS GSM 05.08.

If the channel coding scheme CS4 is used solely on either the uplink or the downlink, a non frequency hopping radio channel NH_RCH will preferably be used for the radio link RL. This means that prior to a change from a frequency hopping radio channel FH_RCH to a non frequency hopping radio channel NH_RCH according to step S5 takes place, it is not necessary for the link adaptation that orders the change to check which channel coding scheme is used on the radio link in the opposite direction. If, on the other hand, a channel coding scheme for one direction of a radio link RL is changed so that the user data is again provided with redundant information with channel coding, i.e. a switch from channel coding scheme CS4 to a lower numbered coding scheme, it is necessary for the link adaptation to check that user data has been provided with channel coding even in the opposite direction of the radio link RL, before ordering a change to a frequency hopping channel FH_RCH.

The above example of the invention has been described with reference to the application of GPRS in the GSM-system. GPRS is applied equivalently in the mobile radio system TDMA/136. The invention is also applied for EDGE in a manner equivalent to that described with respect to GPRS. Although the embodiments primarily describe GPRS and EDGE, it will be understood that the invention can also be applied in all mobile radio systems in which channel coding can be changed, from adding channel coding to user data to terminating the addition of channel coding, and vice versa, during an ongoing connection RL.

As an alternative to sending a stream of channel coded data on a frequency hopping channel, the transmitter antenna can be readily switched to a non frequency hopping channel. This gives the same advantages in indoor cells as those obtained when using a frequency hopping channel. One advantage, however, is that simpler equipment can be used to change the transmitter antenna than that required for a frequency hop.

Figure 7A:
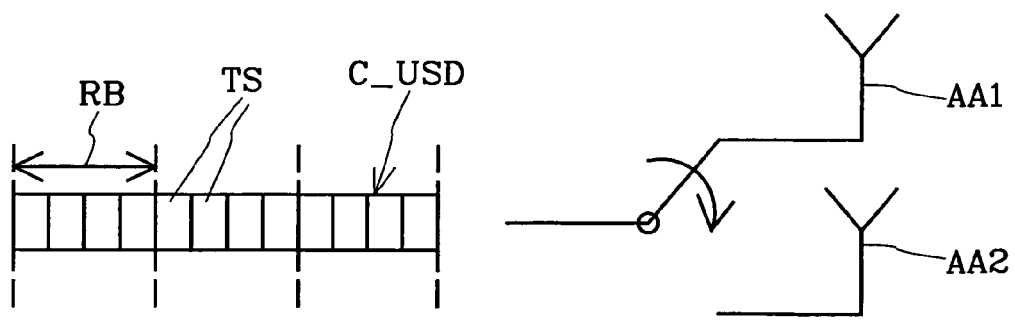
FIG. 7a is a block diagram illustrating a channel coded data stream sent alternately between a first and a second radio antenna.

FIG. 7a shows a stream C_USD of channel coded user data. The channel coded stream C_USD is divided into radio blocks RB that are each sent on a given time slot TS over four consecutive TDMA-frames. A radio block RB thus corresponds to data sent in a burst in four consecutive TDMA-frames. The stream C_USD is sent alternately by a first radio antenna AA1 and a second radio antenna AA2. Switching between the radio antennas AA1, AA2 takes place between each TDMA-frame. Thus, all first time slots TS of a radio block are sent, for instance, over the first antenna AA1 while a second time slot TS of the radio block RB is sent over the second antenna AA2, and the third time slot TS is sent over the first antenna AA1, and so on.

Figure 7B:
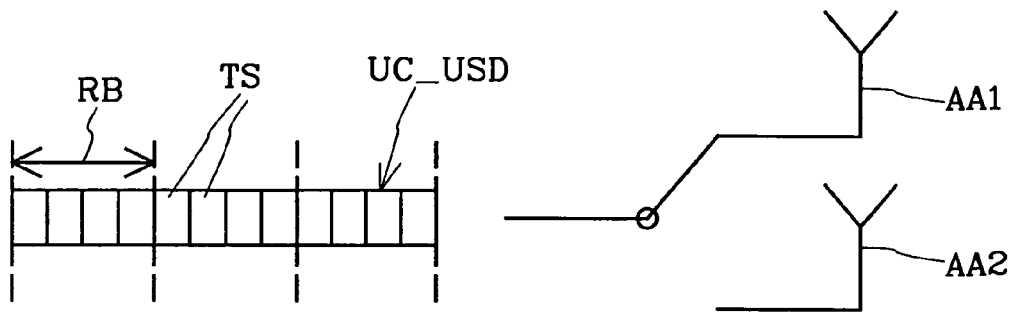
FIG. 7b is a block diagram of a non channel coded data stream sent over a single radio antenna.

Transmission quality is evaluated during transmission. If the transmission quality exceeds a given value, it is decided that channel coding shall be terminated, i.e. that a switch shall be made from channel coding scheme CS1, CS2 or CS3 to channel coding scheme CS4. All bursts of an uncoded radio block RB are sent from one and the same antenna, for instance from the first antenna AA1 according to FIG. 7b.

A change of antenna AA1, AA2 can, however, be effected beneficially between the radio blocks RB in the uncoded stream UC_USD. If transmission via the first antenna AA1 causes a fading dip at the mobile station MS, all radio blocks sent over the first antenna AA1 are knocked out. By switching the transmission antennas AA1, AA2 between the radio blocks, at least each other radio block will be received correctly in the mobile station MS.

The two antennas AA1, AA2 are separated spatially or have different polarisations to obtain antenna diversity. By antenna diversity is meant that the correlation between the antennas is less than 70%.

By channel coding is meant that redundant information is added to the stream of user data, so that error in the transmitted stream of user data can be detected. By channel coding scheme is meant the application of given channel coding or the absence of channel coding on the stream of user data.

Not all mobile radio systems PLMN include a base station controller BSC. Corresponding functions that are managed by the base station controller in the GSM-system are divided between the base transceiver station and the mobile switching centre in other systems. Those functions that are significant to the present invention can be related mainly to the base station system BSS. They can either be included in the base station controller as described with reference to the GSM-system, or corresponding functions can be included in a base transceiver station BTS in a system that lacks a base station controller.

What is claimed is:

1. A method of controlling a radio link (RL) in a mobile radio network (PLMN) for maintaining a high data transmission rate, wherein the mobile radio network (PLMN) includes at least one cell (C1) that has a number of radio channels accessible for radio connection to a corresponding number of mobile stations (MS) within the cell, said method comprising the steps of:
   channel coding (S1) a stream of user data to which redundant information is added, in accordance with a first channel coding scheme;
   transmitting (S2) said stream on a first frequency hopping radio channel (FH_RCH);
   measuring (S3) a transmission quality on the first frequency hopping radio channel (FH_RCH); and, if a measurement of the transmission quality exceeds a predetermined threshold:
   switching (S6) from the first channel coding scheme to a second channel coding scheme that does not add redundant information to said stream of user data, wherein said first channel coding scheme corresponds to CS1, CS2 or CS3 according to GPRS, and wherein said second channel coding scheme corresponds to CS4 according to GPRS; and
   switching (S5) radio channels for sending said stream from the first frequency hopping radio channel (FH_RCH) to a second non frequency hopping radio channel (NH_RCH) in conjunction with the step of switching from the first channel coding scheme to the second channel coding scheme.

2. The method according to claim 1, wherein said change of coding scheme takes place in response to a comparison that shows that said measurement fulfils a pre-set criterion that qualifies said change of channel coding scheme.

3. The method according to claim 1, wherein transmission on said first frequency hopping radio channel or said second non frequency hopping radio channel takes place within said cell (C1) even when the mobile radio network includes several cells.

4. The method according to claim 3, wherein prior to carrying out the steps according to claim 1 said number of radio channels are divided into a group of frequency hopping radio channels (FH_RCH) and a group of non frequency hopping radio channels (NH_RCH).

5. The method according to claim 4, wherein carrier waves (fc, fc1–fc3) for said number of radio channels are divided into two groups, of which a first group has solely said frequency hopping radio channels (FH_RCH) and a second group has solely said non frequency hopping radio channels (NH_RCH).

6. The method according to claim 1, wherein said radio link (RL) includes an uplink and a downlink which are controlled separately in accordance with the method steps.

7. The method according to claim 6, wherein said step of measuring is performed in the downlink in a mobile station (MS), and the measurement is sent in the uplink on PACCH for evaluation.

8. The method according to claim 6, wherein a switch is made from said first frequency hopping radio channel to said second non frequency hopping radio channel for both the uplink and the downlink when said switch is made from said first channel coding scheme to said second channel coding scheme on at least either the uplink or the downlink.

9. The method according to claim 1 comprising the further steps of:
   measuring (S7) the transmission quality on said second non frequency hopping radio channel (NH_RCH);
   switching (S10) from said second channel coding scheme to said first channel coding scheme when the transmission quality measured on the second non frequency hopping radio channel fulfils a given criterion; and
   switching (S9) from said second non frequency hopping radio channel to said first frequency hopping radio channel (FH_RCH) for transmission.

10. A radio base system (BSS) adapted to control at least one radio link (RL) in a given cell for connection to a mobile station (MS) within said cell, wherein a number of radio channels are allocated to said cell and divided into frequency hopping and non frequency hopping channels, said system comprising
   means for measuring transmission quality on said radio link (RL); and
   means for changing a coding scheme for user data sent on said radio link (RL) in accordance with the measured transmission quality, wherein said system is characterized by
   means that when changing a coding scheme from coded to uncoded transmission of user data functions to also change a radio channel for said radio link (RL) from a frequency hopping radio channel to a non frequency hopping radio channel (FH_RCH, NH_RCH).

11. The base station controller that comprises a switch connection, and a base transceiver station connection (BTS) characterized by means for carrying out the method according to claim 1.

12. A method of controlling a radio link (RL) in a mobile radio network (PLMN) for maintaining a high data transmission rate, comprising the steps of:
   channel coding a stream of user data to which redundant information is added in accordance with a first channel coding scheme;
   radio transmitting said stream on a first frequency hopping radio channel, wherein a transmitter antenna for transmitting said stream alternates between two antennas that are separated spatially or with respect to polarization so as to obtain antenna diversity;
   measuring (S3) a transmission quality of the radio transmission; and if said transmission quality exceeds a predetermined threshold:
   switching (S6) from the first coding scheme to a second coding scheme that does not include added redundant information in the stream of user data; and
   effecting radio transmission on a second non frequency hopping radio channel without switching the transmitter antenna.

13. The method according to claim 12, wherein the transmitter antenna alternates between the two spatially separated antennas each time slot (TS).

14. A method of controlling a radio link to enable a high user data rate to be transmitted on the radio link, in a mobile communication system supporting GPRS and having four alternate channel coding schemes, wherein a first three of said four coding schemes add redundant information when applied to a stream of user data, and a fourth of said four coding schemes adds no redundant information when applied to a stream of user data, said method comprising the steps of:
   channel coding a first stream of user data, according to any of said first three coding schemes, to produce a first coded user data stream;
   transmitting said first coded user date stream on a first frequency hopping radio channel in a first cell;
   measuring a transmission quality on said first frequency hopping radio channel;
   changing the coding scheme for coding said first user data stream from any of said first three coding schemes to said fourth coding scheme, to produce an uncoded user data stream, due to the transmission quality reaching a first threshold value; and
   transmitting the uncoded user data stream, on a second, non frequency hopping, radio channel, within the first cell.

15. The method according to claim 14 further comprising the steps of:
   measuring the transmission quality on said second, non frequency hopping, radio channel;
   starting channel coding of said stream of user data, due to the transmission quality on said second radio channel reaching a second threshold value; and
   transmitting the coded user data stream on a third frequency hopping radio channel.

16. A radio base system arranged to control a radio link to a mobile station in a certain cell, wherein a number of radio channels are allocated to the cell and the number of radio channels are divided into a group of frequency hopping channels and a group of non frequency hopping radio channels, said radio base system comprising:
   a receiver for measuring a transmission quality on said radio link;
   a processor for selecting a coding scheme in relation to the measured transmission quality, wherein said coding scheme is selected from three channel coding schemes which add redundant information to the transmitted data or a fourth coding scheme that does not add redundant information to said transmitted data;
   a processor for channel coding a stream of user data sent on the radio link according to a selected coding scheme; and
   means for changing the radio channel for the radio link from a first frequency hopping radio channel to a second non frequency hopping radio channel when a change of channel coding is made from any of said first three channel coding schemes to said fourth coding scheme.

17. A method of controlling a radio link in a mobile radio network for maintaining a high data transmission rate, wherein the mobile radio network includes at least one cell that has a number of radio channels accessible for radio connection to a corresponding number of mobile stations within the cell, said method comprising the steps of:
  channel coding a stream of user data to which redundant information is added, in accordance with a first channel coding scheme;
  transmitting said stream on a first frequency hopping radio channel;
  measuring a transmission quality on the first frequency hopping radio channel; and, if said transmission quality exceeds a predetermined threshold:
  switching from the first channel coding scheme to a second channel coding scheme that does not add redundant information to said stream of user data; and
  switching radio channels for sending said stream from the first frequency hopping radio channel to a second non frequency hopping radio channel in conjunction with the step of switching from the first channel coding scheme to the second channel coding scheme.

* * * * *